United States Patent
Hein et al.

(10) Patent No.: US 8,168,002 B2
(45) Date of Patent: May 1, 2012

(54) DEVICE FOR CLAMPING AND POSITIONING AN EVAPORATOR BOAT

(75) Inventors: Stefan Hein, Blankenbach (DE); Wolfgang Klein, Wörth (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 946 days.

(21) Appl. No.: 11/996,640

(22) PCT Filed: Jul. 27, 2005

(86) PCT No.: PCT/EP2005/008154
§ 371 (c)(1),
(2), (4) Date: Jul. 28, 2008

(87) PCT Pub. No.: WO2007/012342
PCT Pub. Date: Feb. 1, 2007

(65) Prior Publication Data
US 2009/0199767 A1    Aug. 13, 2009

(51) Int. Cl.
*C23C 16/00* (2006.01)
(52) U.S. Cl. ......................... 118/726; 118/727
(58) Field of Classification Search .................. 118/726, 118/727
See application file for complete search history.

(56) References Cited

U.S. PATENT DOCUMENTS

| | | | | |
|---|---|---|---|---|
| 2,969,448 A * | 1/1961 | Alexander | ..................... | 392/388 |
| 3,387,116 A | 6/1968 | Dupuis | | |
| 3,440,085 A * | 4/1969 | Baker et al. | .................... | 427/566 |
| 3,909,458 A * | 9/1975 | Schottmiller et al. | ..... | 252/501.1 |
| 4,436,005 A * | 3/1984 | Hanson | ....................... | 81/177.75 |
| 5,068,915 A * | 11/1991 | Heinz et al. | ......................... | 392/389 |
| 5,265,189 A * | 11/1993 | Schoenherr | ................... | 392/389 |
| 5,373,633 A * | 12/1994 | Satoi et al. | .................... | 29/890.1 |
| 6,110,290 A * | 8/2000 | Maeda | .......................... | 118/725 |
| 6,221,155 B1 * | 4/2001 | Keck et al. | .................... | 117/200 |
| 6,342,103 B1 * | 1/2002 | Ramsay | ........................ | 118/726 |
| 6,415,493 B1 * | 7/2002 | Pawlenko et al. | ............ | 29/281.1 |
| 6,691,993 B2 * | 2/2004 | Anton | ........................... | 269/111 |

FOREIGN PATENT DOCUMENTS

DE   1 237 401   3/1967
DE   40 15 385 A1   11/1991

* cited by examiner

*Primary Examiner* — Keath Chen
(74) *Attorney, Agent, or Firm* — Patterson & Sheridan, L.L.P.

(57) ABSTRACT

The invention relates to a vacuum treatment plant comprising an evaporator (1) for vacuum coating facilities. The evaporator (1) according to the invention comprises a device for guiding a supply line (4) movable in a gripping direction (A) and intended for gripping and positioning an evaporation boat (3) having a base (22) and further comprises two spacers (18, 19) which the movable supply line (4) flexibly connects to the base (22), with the spacers (18, 19) being disposed on one side each with the movable supply line (4) and with the other side on the base (22), thus enabling the first supply line (4) to be forcibly guided, and with the spacers (18, 19) having such a length and configuration between the first supply line (4) and the base (22) that the guidance direction (B) is essentially parallel to the gripping direction (A) at least across a small deflection range of the spacers (18, 19).

1 Claim, 3 Drawing Sheets

DEVICE FOR CLAMPING AND POSITIONING AN EVAPORATOR BOAT

The invention relates to a vacuum treatment plant in accordance with the preamble of claim 1 and an evaporator for vacuum coating facilities in accordance with the preamble of claim 17.

Evaporators are used in particular for the evaporation coating (vacuum vapour deposition) of thin films onto substrates. Modem evaporators intended for sputtering over large surface areas, especially in the case of roll coating or continuous strip coating facilities, consist of an evaporation boat that is securely gripped between two electrically conducting supply lines. When the evaporator is being operated, optimum electrical contact must be ensured between the supply lines—one of which is usually designed to be electrically conducting and one of which is designed as the earth—and the evaporation boat. At the same time, however, the evaporation boats are intended to be as easily replaceable as possible.

Various designs for such evaporators are known from the prior art. For example, U.S. Pat. No. 3,387,116 describes an evaporator in which a trough-like evaporation boat is gripped between a first fixed, strut-like supply line and a thrust member to which spring tension is applied and which is held and guided at a second fixed supply line. This evaporator has the drawback that it is time-consuming to replace the evaporation boat, because the replacement process makes it necessary to use tools to reduce the spring tension, and the boat's removal is inconvenient because it can be accessed only with difficulty.

An evaporator version that was improved in this respect is described in DE 40 14 385, in which the evaporation boat is gripped, by means of spring force, between two strut-like supply lines provided with jaw-like carriers, and the spring force is adjustable by an eccentric member. In addition, this evaporator has a cooling system for the electrically conducting supply line and comprises protective means to protect the slide bearings of the movable, electrically conducting supply line from dirt pick-up or from clogging up. This evaporator does, however, suffer from the disadvantage of having a complicated structural design. Furthermore, the process entails substantial dirt pick-up, which causes the evaporator to be subjected to a relatively high level of wear.

Recently, vacuum treatment facilities have been making use of evaporators in which the evaporation boat is gripped between a stationary earth pin and an axially moving current pin. The current pin is guided via radial slide bearings, in an electrically insulated manner, within a guide sleeve that has a flange which is externally screw-connected to the process chamber wall, thereby ensuring that the evaporator is sealed against atmospheric pressure. The guidance of the current pin makes it necessary to design the guide sleeve to be relatively long, and the guide sleeve protrudes completely into the process chamber. In an operational state, the force needed to grip the evaporation boat is exerted solely via the pressure differential between the atmospheric pressure and the process-chamber pressure, while in its maintenance state, a compression spring that acts within the guide sleeve against the current pin causes the evaporation boat to be pre-tensioned. This design suffers from the disadvantage that the slide bearings and seals are prone to the considerable dirt pick-up that is entailed by the process and which is caused by abrasion inside the slide bearing and by the process atmosphere itself. Moreover, the structural design necessitates very narrow production tolerances, which results in high costs. Additionally, as a result of fixing the position of the current pins, the evaporator bench is fixed within the installation and, especially in a perpendicular manner relative to the vacuum linear-motion leadthroughs, cannot be moved or can be moved only with considerable design modifications, in order, for example, to alter the distance of the evaporation boats from the substrate.

It is the object of the present invention to design a vacuum treatment plant comprising an evaporator and to design an evaporator of the aforementioned type, wherein reliable electrical contacting between the supply lines and the evaporation boat is ensured, though avoiding the disadvantages encountered in the above-described prior art.

This object is solved by a vacuum treatment plant in accordance with claim 1 and an evaporator in accordance with claim 17. Advantageous extensions of the present invention constitute the subject matter of the dependent claims.

In accordance with the invention, the evaporator's movable supply line, which is preferably designed to be electrically conducting, is essentially guided via a parallelogram linkage mechanism within a vacuum treatment plant. This parallelogram linkage causes the movable supply line to be forcibly guided with respect to the other supply line and the evaporation boat.

Parallelogram linkage is characterized by two members that are arranged in parallel to one another in each case and which form a parallelogram. Since the internal angles of a parallelogram always total 360° and because diagonally facing angles are equal, two opposite sides, for example an evaporator's movable supply line in relation to a base, can be moved only in parallel to each other.

Nevertheless, use can, in addition, be made of a parallelogram linkage mechanism that has been modified in this respect and in which two opposite sides are designed to be neither parallel nor of equal length. In this case where, for example, two varyingly long spacers are hingedly disposed between the base and the movable supply line and the longer spacer has a larger tilt between the base and the supply line than the shorter spacer, an essentially parallel movement of the supply line relative to the base can still be ensured in a range of low deflection. Since an evaporator requires only minimal movements of the movable supply line with respect to the evaporation boat and the stationary supply line, such modified parallelogram linkages can, furthermore, be used in the case of the vacuum treatment plant and evaporator according to the invention.

In accordance with the invention, the vacuum treatment plant therefore comprises at least one evaporator having a device for guiding a movable supply line for gripping and positioning an evaporation boat, with the device as parallelogram linkage comprising a base at which a supply line is flexibly connected via two spacers, the spacers having such a length and configuration between the base and supply line as to enable the supply line to be guided essentially parallel to the gripping direction at least across a small deflection range of the spacers.

Compared to guidance mechanisms previously in use for the movable supply line, this parallelogram linkage has a simpler structure, thus making the vacuum treatment plant and evaporator according to the invention much more cost-effective than previous designs. In addition, the parallelogram linkage does not comprise any surfaces or seals that slide over one another, which means that the evaporator and vacuum treatment plant according to the invention are much less prone to the considerable dirt pick-up entailed by the process, e.g. as caused by aluminium and zinc dust. Furthermore, the evaporator according to the invention does not need any a guide sleeve that surrounds the movable supply line. As a result, the evaporator is narrower in design and, compared to previous designs, narrower evaporation-boat distances can be achieved, thereby making it possible to achieve a performance-boost potential in the case of line evaporators, i.e. evaporation boats in a multiple parallel configuration.

Based on an advantageous embodiment, at least one spacer is designed to be rigid and is arranged, by means of hinged joints, on the base and movable supply line. At least one spacer can, however, also be designed as a leaf or rectangular plate spring. At the same time, such a leaf spring does in fact advantageously make a pre-tension available, which pre-tension takes effect in the gripping direction.

If two rigid spacers are used, it is preferable to provide means for making this pre-tension available, with the pre-tension being particularly intended to be 50 N. In the maintenance state, in other words when no gripping force is made available by suitable means, this pre-tension can be used to provide a tensioning force upon the evaporation boat between the two supply lines, which force ensures that the evaporation boat is positioned reliably.

Particular preference is placed on giving the linkage at least one vertical limit stop member for limiting the ability of the movable supply line to move towards the base. This prevents spacers designed as leaf springs from being able to buckle in the maintenance state.

It is, moreover, an advantage for at least one horizontal limit stop member to be provided in order to limit the movement of the movable supply line in the gripping direction. As a result, it is possible, on the one hand, to limit the movement towards the region in which the movement still occurs in a manner largely parallel to the gripping direction, and on the other hand, this prevents the parallelogram linkage members from being exposed to excessive loads, such as may by caused by improper handling in the maintenance state.

The movable supply line is advantageously positioned on a plate, with the spacers being located on the plate. If the plate itself or an intermediate layer between the plate and supply line is electrically insulating, the supply line can be electrically insulated from the linkage with particular ease.

Two horizontal limit stops are now particularly advantageously formed in that the plate has projections that protrude laterally and the design of which complements two jaws that are positioned on the vertical limit stop member or members. In this way, the horizontal stops and the vertical stop member can be integrated into the linkage with particular ease from the point of view of their structural design.

In the operating state, the gripping pressure that grips the evaporation boat between the two supply lines is advantageously made available by a compression spring that acts upon the movable supply line directly or acts upon the plate, thus ensuring that the evaporation boat is electrically contacted to optimum effect under all operating conditions. It is particularly preferred that a pneumatic member be provided in order to subject the compression spring to load or to relieve the spring thereof, with the result that the gripping pressure exerted by the compression spring in the evaporator's maintenance state can be reduced or removed altogether, thereby causing just the pre-tension of the leaf springs to act upon the evaporation boat.

In a preferred embodiment, the movable supply line is not integral in design, but comprises a current pin and a copper block to which the supply of current is connected and which is joined to the parallelogram linkage in an electrically insulated manner. The current pin is advantageously attachable to the copper block by means of a loose flange, thus making it particularly simple to install and dismantle the current pins, which are subject to considerable wear as a result of evaporator operation, and thereby enabling the current pin to be rotated in a continuously variable manner with respect to the copper block.

The second supply line preferably has an earth pin and the evaporator's earth pin and/or current pin has/have a plurality of jaw-like carriers for the evaporation boat. In this way, the pins, which are subjected to considerable wear, can be used with greater economy because their service life is increased. The earth pin preferably has four jaw-like carriers positioned in a rotationally symmetrical manner all around a quadratic base and the current pin's jaw-like carrier is formed by an annular or circular base.

To increase the current pin's durability, this pin preferably has a blind-end bore with a coolant distributor pipe connected to corresponding cooling-water supply and discharge lines within the copper block, thereby enabling the temperature of the electrically conducting supply line to be adjusted while the evaporator is being operated. The movable supply line may, however, be fitted with other suitable cooling devices as well.

An advantageous extension is for the evaporator to be adjustably formed within the vacuum treatment plant in relation to a substrate that is to be sputtered. The distance of the evaporator is preferably adjustable relative to the substrate. In this way, for example, the entire evaporator unit can be attached to a variable-height member.

Further characteristics, features and advantages of the vacuum treatment plant and evaporator according to the invention will be explained in the following exemplary embodiment that is described in more detail hereinbelow on the basis of the corresponding drawings.

Figure 1:
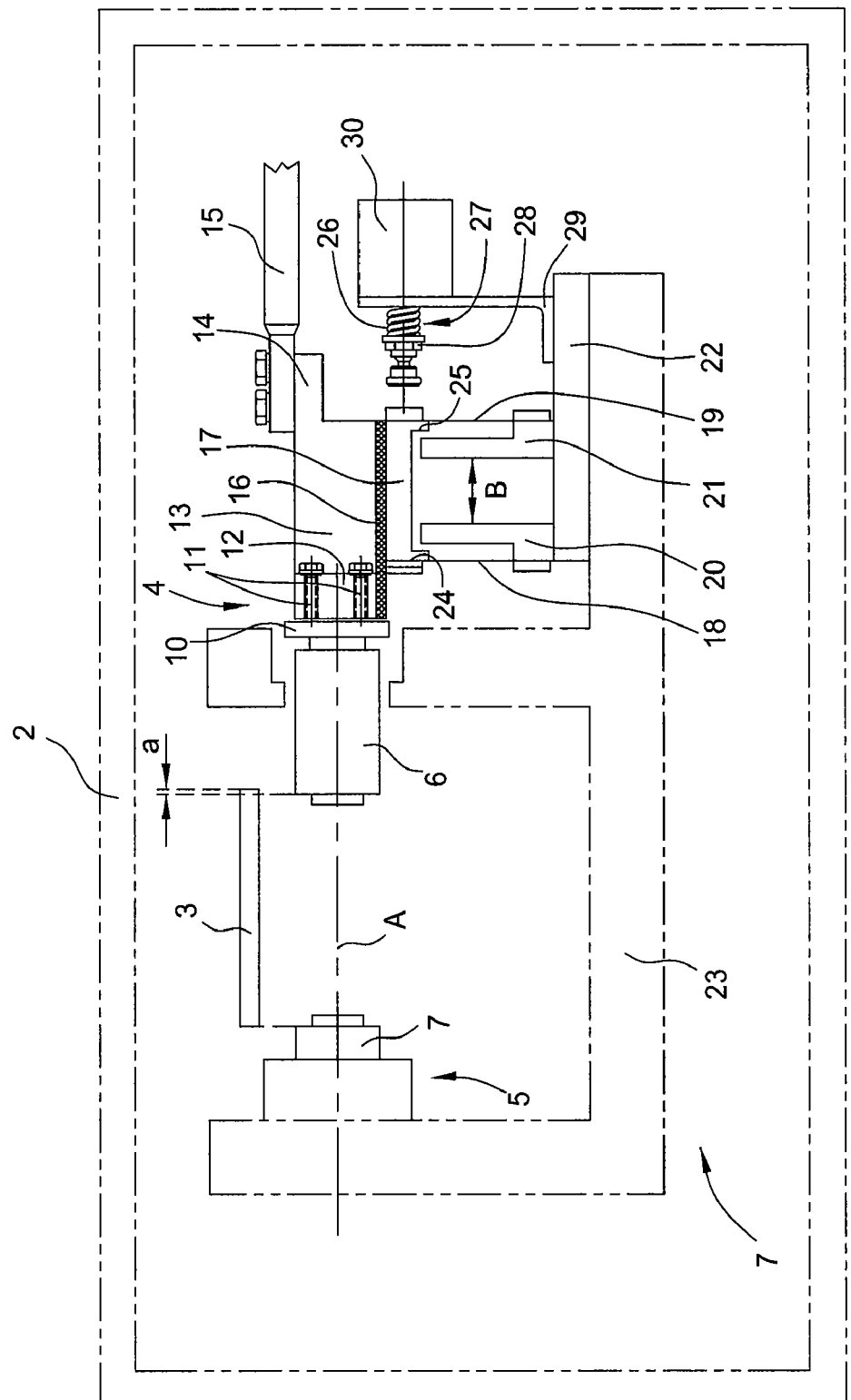
FIG. 1 shows a side view of an exemplary embodiment of the evaporator according to the invention in its maintenance state.
Figure 2:
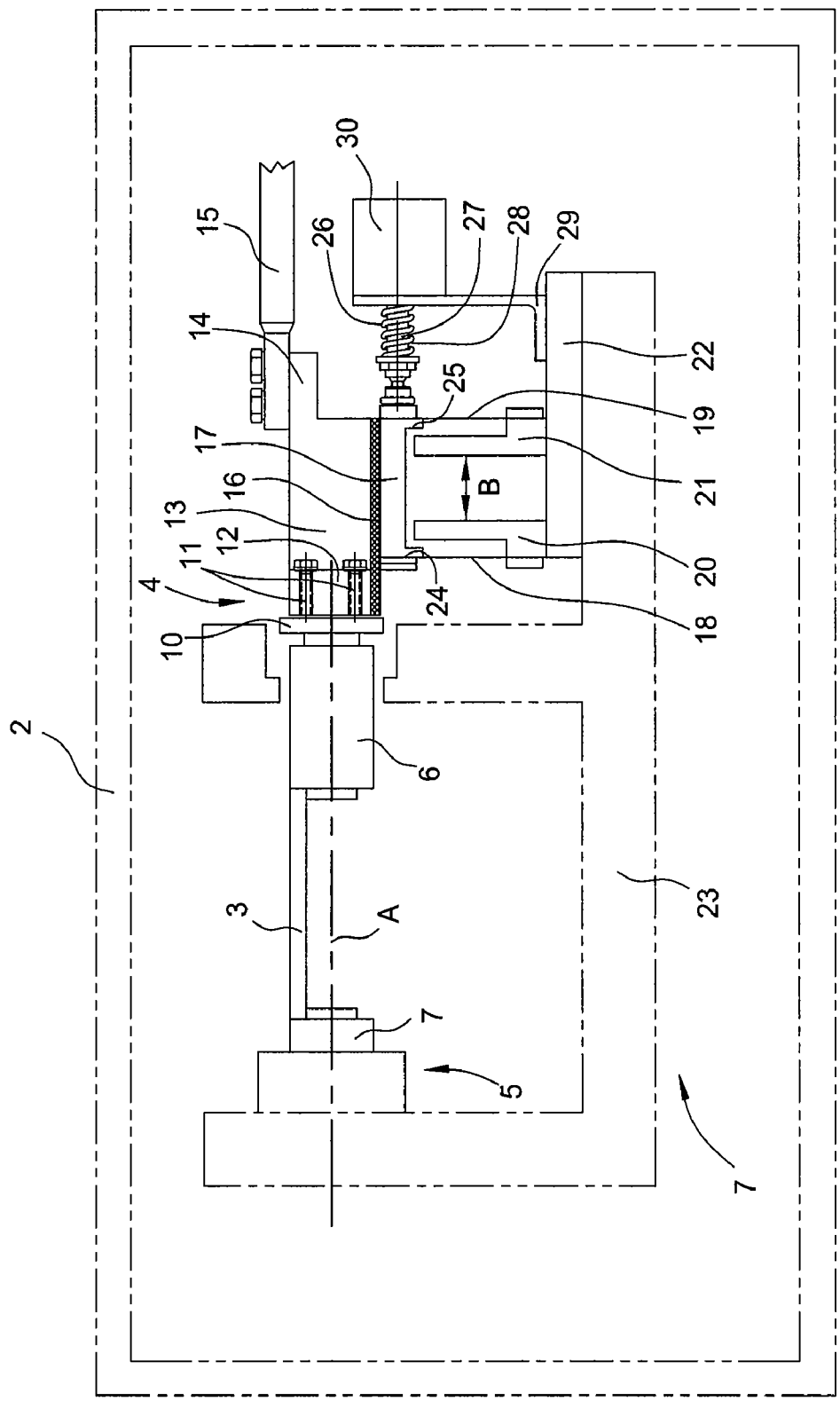
FIG. 2 shows a side view of the exemplary embodiment in FIG. 1 with the evaporator according to the invention in its operating state.

FIG. 1 represents a preferred exemplary embodiment of the evaporator 1 according to the invention for vacuum coating facilities in its maintenance state. The evaporator 1 is located within a process chamber 2 of the vacuum treatment plant and comprises an evaporation boat 3 that is not gripped in its maintenance state and which, in its operating state (cf. FIG. 2), is received between a first supply line 4 and a second supply line 5 in a gripping direction A. The first supply line 4 has a current pin 6 that is provided with a jaw-like carrier 8, 9, as is the earth pin 7 of the second supply line 5, in order to enable the evaporation boat 3 to be received at the end face.

The current pin 6 has a loose flange 10 at its end that faces the evaporation boat carrier 8. This loose flange 10 can be used to attach the current pin 6 to the carrier 12 of a copper block 13 via suitable securing means, preferably screws 11, in a form-locked and electrically conducting manner. The copper block 13 has a further carrier 14 to which the power supply 15, a flexible copper strip in the example depicted, can be attached so as to bring about a supply of current, via the current pin 6, to the evaporation boat 3 in the operating state. The underside of the copper block 13 is provided with an electrical insulation means 16 to which a plate 17 is attached.

Attached to the plate 17 are two leaf or rectangular plate springs 18, 19 which are in turn secured via two vertical limit stop members 20, 21 that are themselves attached to a base 22. The two leaf springs 18, 19 are each connected to an end face of the plate 17 in a plane-parallel manner relative to one another and are each secured to the two vertical limit stop members 20, 21 at their opposite end. The manner of attaching the leaf springs 18, 19 to the plate 17 and the limit stop members 20, 21 can be brought about by using any suitable securing means, in particular a screw-type attachment. The leaf springs 18, 19 are made of a spring steel, which causes the plate 17 to remain movable in relation to the second base 22, thereby simultaneously providing a pre-tension that acts upon the plate 17 whenever the leaf springs 18, 19 are deflected out of their state of equilibrium (neutral position) shown in FIG. 1 and which is automatically obtained in the maintenance state. Since not only the plate 17 and base 22 but also the two leaf springs 18, 19 are each positioned parallel to one another, a parallelogram linkage mechanism is defined which provides a forcibly guided movement of the plate 17 relative to the base 22 in the guidance direction B parallel to the plate 17 and base 22. The base 22 is detachably secured, parallel to the gripping direction A, to a support member 23 to which the fixed second supply line 5 is attached as well, and, in its detached state, the base 22 can move in the gripping direction A. As a result, the guidance direction B is always parallel to the gripping direction A.

The vertical limit stop members 20, 21 delimit the vertical deflection of the plate 17 towards the base 22. This prevents the leaf springs 18, 19 from possibly buckling on account of improper handling in the maintenance state. The deflection of the plate 17 in guidance direction B is restricted by two horizontal limit stops that are formed by the lateral projections 24, 25 of the plate 17, which projections cooperate with the vertical limit stop members 20, 21.

The base 22 is secured to the support member 23 in the gripping direction A in such a way that the distance between the jaw-like carriers 8, 9 of the current and earth pins 6, 7 in the maintenance state is smaller by an amount a than the length of the evaporation boat 3. In this way, after the evaporation boat 3 has been inserted between the current pin 6 and earth pin 7, the first supply line 4 is deflected by the amount a, which preferably amounts to several millimeters, and the leaf springs 18, 19 are deflected out of their state of equilibrium, as indicated by the S-shaped configuration of leaf springs in FIG. 2. In the maintenance state, therefore, a pre-tension that acts on the inserted evaporation boat 3 and which amounts to 50 N in the depicted example is made available via the leaf prints 18, 19. It is thus ensured that the evaporation boat 3 can be positioned exactly between the two pins 6, 7 and that it also retains this position and that, in particular, there is no risk that the evaporation boat 3 will fall out of the evaporator 1 during maintenance.

To make a tensioning of the evaporation boat 3 available in the operating state (cf. FIG. 2), a compression spring 26 is provided; this spring is placed on a shaft 27 and extends between a head-like thickening of the shaft 28 and a spring limit stop 29 that is secured to the base 22. A pneumatic member 30 is likewise positioned on the spring limit stop 29 and acts, via the shaft 27, upon the compression spring 26 in a manner that applies a load thereto or relieves it of a load.

When the evaporator 1 is being operated, the current pin 6 is pressed against the evaporation boat 3 via the compression spring 26, which acts upon the plate 17 via the shaft head 28, with such a force that the evaporation boat 3 is held between the current pin 6 and the earth pin 7, thus creating optimum electrical contact between these three members. The jaws 8, 9 of the pins 6, 7 can be coated with a graphite foil in order to improve the contacting of the evaporation boat 3 and to compensate for surface roughness. In the maintenance state of the evaporator 1, the pneumatic member 30 retracts the shaft 27 so that the compression spring 26 no longer acts upon the plate 17, and, instead, only the pre-tension exhibited by the leaf springs 18, 19 does so.

Figure 3:
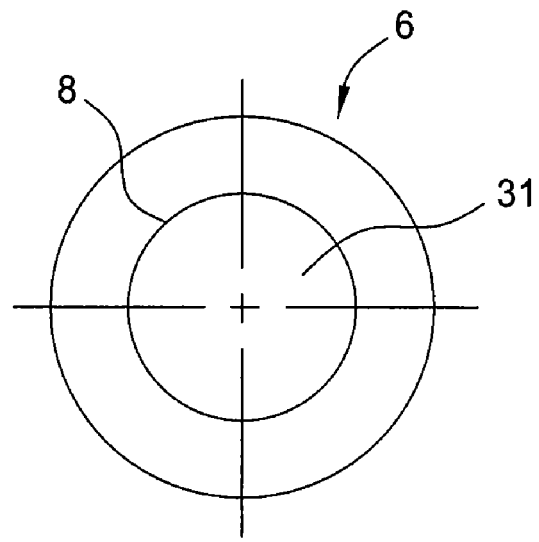
FIG. 3 shows a view of the end face of a current pin according to the invention and FIG. 4 shows a view of the end face of an earth pin according to the invention.
Figure 4:
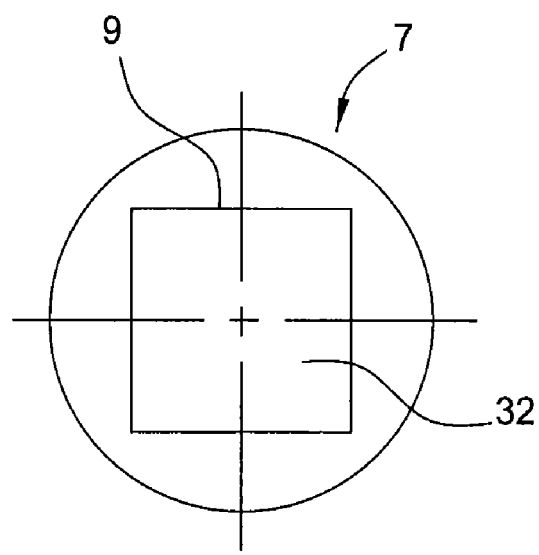

A plurality of jaw-like carriers 8, 9 can be positioned both on the current pin 6 and on the earth pin 7 in a rotationally symmetrical manner around the end faces of the preferably cylindrically shaped pins 6, 7. The current pin 6 advantageously has an axially symmetrical base 31 that protrudes in a circular manner at its end face (cf. FIG. 3). The loose flange 10 makes it possible for the current pin to be rotated around the carrier 12 of the copper block 13 in a continuously variable fashion. Since the current pin 6 is subjected to a high level of wear on account of the high power consumption of the evaporation boat 3, the complete utilization of the current pin 6 will thus make it possible to reduce how often the current pin 6 is replaced. As a result of a quadratic base 32, preferably four receiving jaws 9 are formed in an axially symmetrical manner on the earth pin 7, thus enabling the earth pin 7 to be used four times (cf. FIG. 4). The straight support surfaces of the quadratic base 32 serve as positioning aids for the evaporation boat 3.

Of course, differently shaped receiving jaws 8, 9 of the pins 6, 7 are possible as well if the end faces of the evaporation boat 3 are shaped differently. It is nevertheless desirable for the end faces of the evaporation boat 3 to make contact with the entire surface area of the jaw-like carriers 8, 9 of the pins 6, 7 in order to ensure optimum electrical contact.

In addition to the embodiment depicted in FIG. 1, it is possible to provide a water cooling system that runs within the copper block 13 and feeds a blind-end bore within the current pin 6. A coolant distributor pipe within the current pin 6 and a suitable water connection between the loose flange 10 of the current pin 6 and carrier 12 of the copper block 13 then permits water to be exchanged directly between a supply line and a discharge line and hence enables the first supply line 4 to be cooled as a whole.

The above description makes it apparent that in the evaporator according to the invention, the guidance of the first supply line 4 is effected via the parallelogram linkage as part of a very simple structural design that entails a low level of wear. The evaporator 1 does not have any surfaces or seals that slide over one another. As a result, the evaporator 1 is less prone overall to the considerable dirt pick-up entailed by the process. Due to its simple structural design, the evaporator 1 is cheaper to produce than previous evaporator designs. In consequence, the vacuum treatment plant according to the invention can, moreover, be operated with greater economy. Additionally, the evaporator 1 is narrower in design than previous evaporators, with the result that, on account of the narrower distance between evaporation boats that is to be obtained by this approach in the case of an inline evaporator, the evaporator 1 according to the invention overall offers the potential to boost the performance of the vacuum treatment plant according to the invention. Furthermore, in the case of the evaporator 1 according to the invention, in contrast to the prior-art evaporators, the distance of the evaporation boats 3 relative to the substrate can be variably adjusted with ease in that the entire evaporator unit is attached, by means of the support member 23, to a variable-height member.

The invention claimed is:

1. A vacuum treatment plant, in particular a roll coating plant, having at least one evaporator disposed within a process chamber, said evaporator comprising:
    an evaporation boat that can be controlled in terms of its power and which is heated by the passage of current, said evaporator further comprising two a first electrical supply lines and a second electrical supply line between which said evaporation boat can be gripped, said first supply line being movable with respect to said second supply line in a gripping direction; and a device for guiding said first supply line so as to grip and position said evaporation boat between said supply lines, wherein said device for guiding said first supply line comprises at least two spacers and a base, and said first supply line is movably connected to said base via said spacers, a first side of said spacers being attached to said first supply line and a second side of said spacers being attached to said base, thereby enabling said first supply line to be forcibly guided, said spacers having such a length and configuration between said first supply line and said base that the guidance direction is essentially parallel to the gripping direction at least across a small deflection range of said spacers, and wherein at least one spacer is designed as a leaf spring that provides a pre-tension in the gripping direction and at least against said second supply line.

* * * * *